United States Patent
Lee et al.

(10) Patent No.: US 7,085,882 B2
(45) Date of Patent: Aug. 1, 2006

(54) SRAM-COMPATIBLE MEMORY AND METHOD OF DRIVING THE SAME

(75) Inventors: Sun Hyoung Lee, Seoul (KR); In Sun Yoo, Icheon-si (KR); Dong Woo Shin, Icheon-si (KR)

(73) Assignee: Silicon7 Inc. (KR)

( * ) Notice: Subject to any disclaimer, the term of this patent is extended or adjusted under 35 U.S.C. 154(b) by 302 days.

(21) Appl. No.: 10/695,532

(22) Filed: Oct. 28, 2003

(65) Prior Publication Data

US 2004/0090840 A1 May 13, 2004

(30) Foreign Application Priority Data

Nov. 11, 2002 (KR) ............ 10-2002-0069598

(51) Int. Cl.
*G06F 12/00* (2006.01)
(52) U.S. Cl. ............ 711/106; 711/105
(58) Field of Classification Search ............ None
See application file for complete search history.

(56) References Cited

U.S. PATENT DOCUMENTS 5,999,474 A * 12/1999 Leung et al. ............ 365/222
6,757,784 B1 * 6/2004 Lu et al. ............ 711/118
2002/0016942 A1 * 2/2002 MacLaren et al. ............ 714/718
2003/0106010 A1 * 6/2003 Fujioka et al. ............ 714/763
2003/0185078 A1 * 10/2003 Tsukude ............ 365/222

FOREIGN PATENT DOCUMENTS

KR 10-0190248 1/1999
KR 2002-0025272 4/2002

* cited by examiner

*Primary Examiner*—Mano Padmanabhan
*Assistant Examiner*—Craig E Walter
(74) *Attorney, Agent, or Firm*—Cantor Colburn LLP (57) ABSTRACT

Disclosed herein are an SRAM-compatible memory and method of driving the SRAM-compatible memory. The SRAM-compatible memory has memory banks, a parity generator and a parity bank. The memory banks each store corresponding one of input data in its DRAM cells specified by an input address. The memory banks perform write operations independently such that when a refresh operation or a write operation for a previous frame is being performed with respect to DRAM cells of a certain memory bank, the write operation of the input data is independently performed with respect to the respective memory banks except for the certain memory bank. The parity generator generates a input parity determined based on the input data and a certain preset parity value. The parity bank stores the input parity.

14 Claims, 6 Drawing Sheets

SRAM-COMPATIBLE MEMORY AND METHOD OF DRIVING THE SAME

BACKGROUND OF THE INVENTION

1. Field of the Invention

The present invention relates to semiconductor memory devices and, more particularly, to a memory device compatible with a static random access memory SRAM), which employs dynamic random memory (DRAM) cells, and a method of driving the SRAM-compatible memory.

2. Description of the Related Art

In general, random access memory (RAM) devices are classified into static RAM (SRAM) devices and dynamic RAM (DRAM) devices. A typical RAM includes a memory array composed of a plurality of unit memory cells arranged in a matrix form defined by rows and columns, and peripheral circuits adapted to control the input/output of data to/from the unit memory cells. Each of the unit memory cells of an SRAM stores one bit of data and is implemented by use of four transistors that form a latch structure and two transistors that act as transmission gates. Since a general SRAM stores data in unit memory cells each having a latch structure, a refresh operation is not required to maintain stored data. Furthermore, the SRAM devices have the advantages of rapid operating speed and low power consumption compared to the DRAM devices.

However, since each unit memory cell of an SRAM is composed of six transistors, the SRAM is disadvantageous in that it requires a large wafer area compared to a DRAM in which each unit memory cell is implemented using a transistor and a capacitor. In more detail, to manufacture a semiconductor memory device of the same capacity, the SRAM requires a wafer about six to ten times larger than that of the DRAM. The necessity of such a large wafer increases the unit cost of the SRAM. When a DRAM, instead of an SRAM, is used to reduce the cost, a DRAM controller is additionally required to perform a periodic refresh operation. Furthermore, the entire performance of a system is deteriorated due to the time required to perform the refresh operation and a slow operating speed.

In order to overcome the disadvantages of the DRAM and the SRAM, attempts have been made to implement an SRAM using DRAM cells. One of these attempts is the technology of effectively hiding a refresh operation from the outside, thus making the memory compatible with the SRAM.

For a write access operation in the conventional SRAM-compatible memory technology, there have been developments such as a method of internally securing a separate refresh period in a write access operation period, or delaying write access timing so as to secure the time required for the refresh of the DRAM cells of a memory array.

However, in the conventional SRAM-compatible memory technology, access timing for a write operation is delayed, so that a problem arises in that the overall operating speed of the SRAM-compatible memory is reduced.

SUMMARY OF THE INVENTION

The above mentioned and other problems and deficiencies occurring in the prior art are overcome or alleviated by a memory employing DRAM cells and compatible with an SRAM and a method of controlling the memory. Such an SRAM-compatible memory is capable of preventing a reduction in the speed of a write operation due to a refresh operation.

In order to accomplish the above and other objects, the present invention provides an SRAM-compatible memory which has a plurality of memory banks each having a plurality of DRAM cells arranged in a matrix form defined by rows and columns, and is capable of interfacing with an external system in which no timing period is externally set for a refresh operation of the DRAM cells. The SRAM-compatible memory includes the plurality of memory banks for storing input data in DRAM cells specified by an input address, wherein write operations of the memory banks are independently controlled such that a refresh operation or a write operation for a previous frame is being performed in a certain memory bank, write operation of input data is independently performed with respect to the respective memory banks except for the certain memory bank; a parity generator for generating an input parity based on the input data, the input parity having a certain preset parity value in conjunction with the input data; and a parity bank for storing the input parity.

In another aspect, the present invention provides a method of driving an SRAM-compatible memory that has a plurality of memory banks each having a plurality of DRAM cells arranged in a matrix form defined by rows and columns, and is capable of interfacing with an external system in which no particular timing period is externally set for a refresh operation of the DRAM cells. The method comprises the steps of providing multiple pieces of input data to the memory banks, each piece of the input data being provided to corresponding one of the memory banks; determining whether a refresh operation or a write operation for a previous frame is being performed in each of the memory banks; storing a piece of the input data in a data buffer if the refresh operation or the write operation is being performed in a certain memory bank, in which the piece of the input data is provided to the certain memory bank and write operation of the piece of the input bank is suspended; and writing the piece of the input data stored in the data buffer into DRAM cells of the certain memory bank after the refresh operation or the write operation is completed. The memory banks except for the certain memory bank independently perform write operations while the refresh operation or the write operation for the previous frame is performed with respect to DRAM cells of the certain memory bank.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Reference now should be made to the drawings, in which the same reference numerals are used throughout the different drawings to designate the same or similar components.

An SRAM-compatible memory of the present invention uses DRAM cells and performs refresh operations when viewed from an internal standpoint, but does not allocate an operation period for a refresh operation when viewed from an external standpoint. In other words, the refresh operation that is internally performed is not externally observable from the outside of the SRAM-compatible memory of the present invention. Additionally, the SRAM-compatible memory does not require external control signals to control the refresh operations, and can be operated according to the same rules as a typical SRAM.

The SRAM-compatible memory of the present invention has a data input/output structure capable of simultaneously receiving multiple pieces of data, respectively storing the multiple pieces of data in multiple memory banks, and simultaneously outputting the multiple pieces of data stored in the memory banks. In the present specification, data provided from an external or other system to the SRAM-compatible memory of the present invention is referred to as "input data," and data provided from the SRAM-compatible memory to an external or other system is referred to as "output data."

Figure 1:
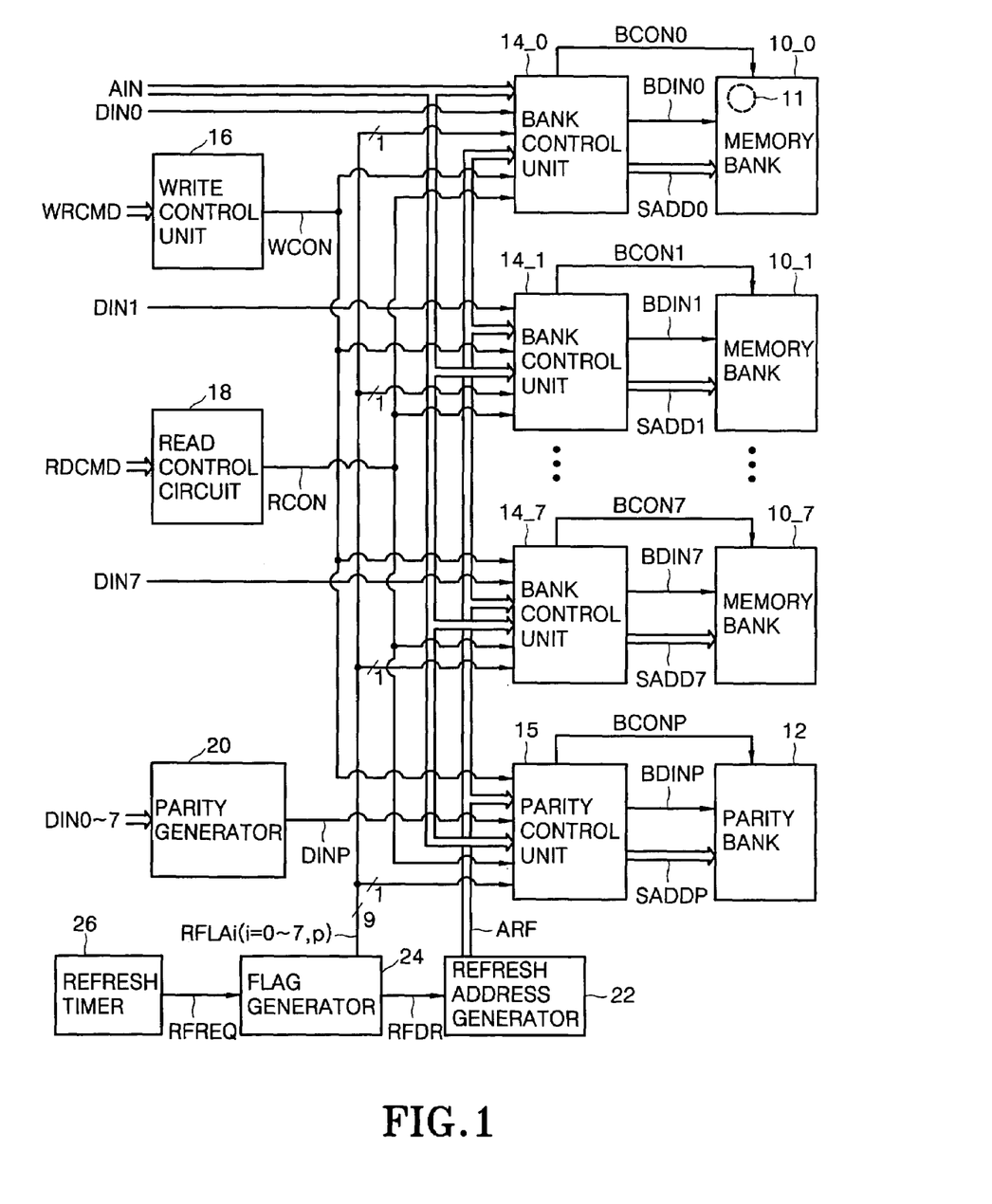
FIG. 1 is a block diagram illustrating an SRAM-compatible memory according to an embodiment of the present invention.

FIG. 1 is a block diagram illustrating an SRAM-compatible memory according to an embodiment of the present invention. In the SRAM-compatible memory according to the embodiment of the present invention, eight pieces of input data are simultaneously input, and eight pieces of data are simultaneously output.

Referring to FIG. 1, the SRAM-compatible memory according to the embodiment of the present invention includes eight memory banks 10_0 to 10_7 and a parity bank 12. The SRAM-compatible memory further includes eight bank control units 14_0 to 14_7 for controlling the memory banks 10_0 to 10_7, respectively, and a parity control unit 15 for controlling the parity bank 12. The SRAM-compatible memory further includes a write control circuit 16, a read control circuit 18, a parity generator 20, a refresh address generator 22, a flag generator 24 and a refresh timer 26.

Figure 2:
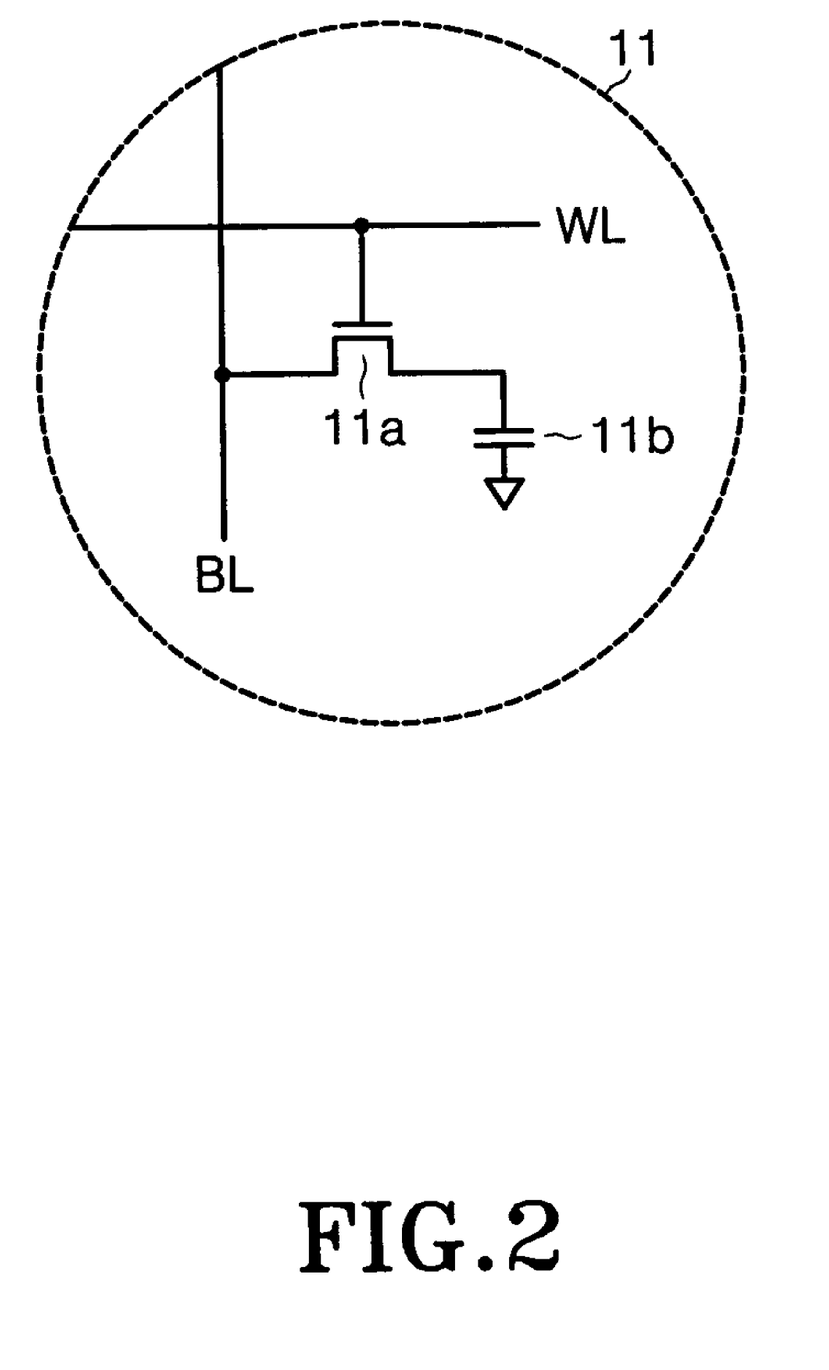
FIG. 2 is a diagram showing a memory cell included in a memory bank and a parity bank of FIG. 1.

Each of the memory banks 10_0 to 10_7 and parity bank 12 includes a plurality of memory cells 11 that are arranged in a matrix form defined by rows and columns. For example, the memory banks 10_0 to 10_7 have the substantially same capacity and structure, and the parity bank 12 has the substantially same capacity and structure as each of the memory banks 10_0 to 10_7. The memory cells 11 are cells that require a refresh operation at a certain refresh period to maintain data stored therein. For example, the memory cells 11 each may be implemented with a DRAM cell. Only for the convenience of description, the memory cells 11 will be referred to as "DRAM cells." The DRAM cell 11, as shown in FIG. 2, includes a transmission transistor 11a that is gated by a signal provided through a word line WL, and a capacitor 11b that stores data provided through a bit line BL and transmitted through the transmission transistor 11a.

The memory banks 10_0 to 10_7 independently perform write operations. For example, while a refresh operation or a write operation for a previous frame is being performed in a certain memory bank, each of the input data for the remaining memory banks is written into the DRAM cells of corresponding one of the seven remaining memory banks.

Referring to FIG. 1, the input data DIN0 to DIN 7 are provided to the bank control units 14_0 to 14_7, respectively. The input data DIN0 to DIN 7 provided to the bank control units 14_0 to 14_7 are provided to the memory banks 10 in response to a bank write control signal WCON. For example, when a refresh operation or a write operation for a previous frame is not being performed in a memory bank 10_0, . . . , or 10_7, the input data DIN0, . . . , or DIN7 corresponding to the memory bank is written into the memory bank 10_0, . . . , or 10_7 though the corresponding bank control unit 14_0, . . . , or 14_7. In this case, the input data DIN0, . . . , or DIN7 is transferred to the corresponding memory bank 10_0, . . . , or 10_7 in response to the write control signal WCON. The bank control units 14_0 to 14_7 control the input data DIN0 to DIN 7 to be written into DRAM cells 11 specified by internal address signals AIN.

While a refresh operation or a write operation for a previous frame is being performed with respect to one or more DRAM cells 11 in a certain memory bank 14_0, . . . , or 10_7, the writing of input data DIN0, . . . , or DIN7 to the DRAM cells is suspended. In this case, the input data whose writing is the suspended is temporarily stored in the data buffer 303 (see FIG. 3) of the bank control unit 14_0, . . . , or 14_7. The temporarily stored input data is written into the DRAM cells of the corresponding memory bank 10_0, . . . , or 10_7 after the performance of the refresh operation or write operation for the previous frame has been completed. In this embodiment, the DRAM cells in the respective eight memory banks 10_0 to 10_7 have the same address format. Thus, each of the input data DIN0 to DIN7 is written into corresponding one of the memory banks 10_0 to 10_7 by being addressed with the same address format.

The parity bank 12 writes an input parity DINP, which is provided from the parity generator 20, to the DRAM cell 11 thereof through the parity control unit 15 in response to the write control signal WCON. However, for the parity bank 12, while a refresh operation or a write operation for a previous frame is being performed with respect to one or more DRAM cells, the writing of the input parity DINP is suspended and the input parity DINP is temporarily stored in a parity buffer (not shown) of the parity control unit 15, like the memory banks 10_0 to 10_7. In other words, the parity buffer in the parity control unit 15 is equivalent to the data buffer in the bank control unit. DRAM cells in the parity bank 12 are specified by the same internal address AIN to store the input parity BDINP as the DRAM cells are specified in the eight memory banks 10_0 to 10_7.

The bank control units 14_0 to 14_7 and the parity control unit 15 generate bank control signals BCON0 to BCONP in response to refresh flag signals RFLA0 to RFLAP provided from the flag generator 24. The bank control signals BCON0 to BCONP control the memory banks 10_0 to 10_7 and the parity bank 12 to enter into refresh operations.

Furthermore, the bank control units 14_0 to 14_7 and the parity control unit 15 receive the input address AIN received from the outside and the refresh address ARF provided from the refresh address generator 22. The bank control units 14_0 to 14_7 and the parity control unit 15 are controlled by the refresh flag signals RFLA0 to RFLAP, respectively, so that the memory banks 10_0 to 10_7 and parity bank 12 are provided with the input address AIN or the refresh address ARF as a selection address SADD. For example, the refresh address ARF is provided as the selection address SADD to one(s) of the memory and parity banks, which receive the active refresh flag signal. The input address AIN is provided as the selection address SADD to one(s) of the memory and parity banks, which receive the inactive refresh flag signal. The memory banks 10_0 to 10_7 and the parity bank 12 entering into the refresh operation refresh DRAM cells specified by the refresh address signal ARF.

The write control unit 16 receives a write command WRCMD and generates the write control signal WCON.

The parity generator 20 receives the input data DIN0 to DIN7 and provides the input parity DINP. The input parity DINP has a certain preset parity value in conjunction with the input data DIN0 to DIN7. For example, in the case where the preset parity value is set to '0 (even)', the input parity DINP is '1' if the total number of the '1' bits of each of the input data DIN0 to DIN7 is odd. If the total number of the '1' bits of each of the input data DIN0 to DIN7 is even, the input parity DINP is '0'. In the case where the preset parity value is set to '1 (odd)', the input parity DINP has a value opposite to that in the case where the preset parity value is set to "0 (even)".

The refresh timer 26 generates a refresh request signal RFREQ that is activated at regular intervals, that is, refresh periods. The flag generator 24 generates a refresh driving signal RFDR that is activated in response to the refresh request signal RFREQ. The flag generator 24 generates nine refresh flag signals RFLA0 to RFLAP that are cyclically activated in response to the refresh request signal RFREQ. The refresh address generator 22 provides the eight memory banks 10_0 to 10_7 and the parity bank 12 with the refresh address signal ARF whose designated address is changed in response to the ninth activation of the refresh driving signal RFDR.

Accordingly, in the present embodiment, DRAM cells connected to the word line of the same address in the memory banks 10_0 to 10_7 and the parity bank 12 are sequentially refreshed, and the refresh address signal ARF specifying a word line to be refreshed is changed in response to every ninth activation of the refresh driving signal RFDR. Therefore, the memory banks 10_0 to 10_7 and the parity bank 12 sequentially perform a refresh operation. Thus, the case where refresh operations are simultaneously performed in two memory banks does not occur.

Furthermore, a variation of the present embodiment may be designed such that, after all DRAM cells connected to a word line in one memory bank are refreshed, all DRAM cells connected to a word line in another memory bank are refreshed. Since the implementation of such variation of the present invention is apparent to those skilled in the art, a description of the implementation of the variation is omitted.

The read control circuit 18 receives a read command RDCMD from the outside, and provides the read control signal RCON to the memory banks 10_0 to 10_7 and the parity bank 12 through the bank control units 14_0 to 14_7 and the parity control unit 15, thus controlling the reading of data.

The SRAM-compatible memory of the present invention may effectively perform a read operation using the input parity DINP written into the parity bank 12. For example, the writing of input data of the present frame may not be completed because a refresh operation or a write operation for a previous frame is being performed in any of the memory banks 10_0 to 10_7. In this case, it is possible for the SRAM-compatible memory to extract the input data, whose writing has not been completed, through an error corrector using the input parity DINP. Such a correction of the input data, whose writing has not been completed, is the advantage of the SRAM-compatible memory of the present invention.

Figure 3:
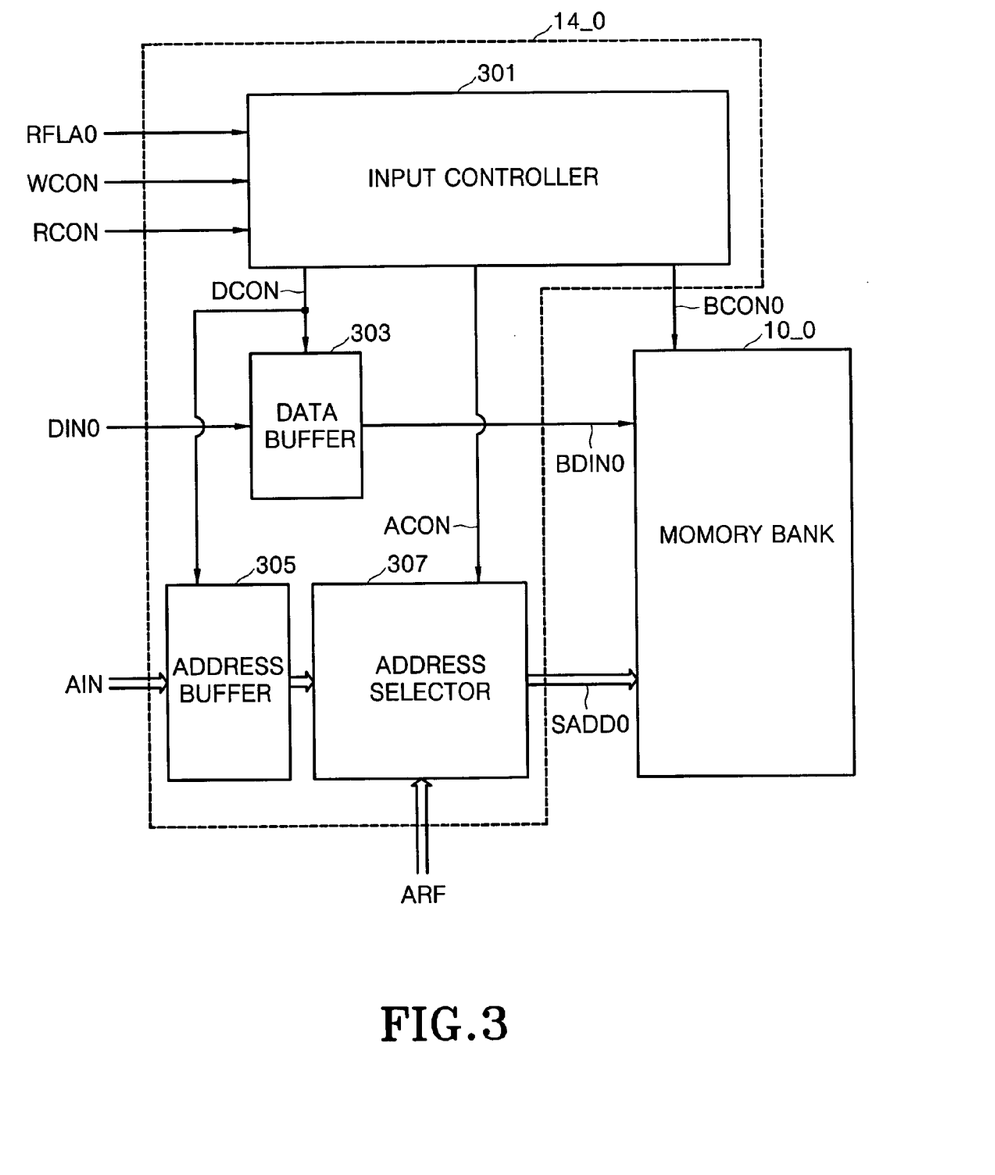
FIG. 3 is a diagram showing a bank control unit of FIG. 1 in detail.

The bank control units 14_0 to 14_7 and the parity control unit 15 have the substantially same construction, but receive different input signals. Accordingly, in the present specification, the bank control unit 14_0 of FIG. 1 is representatively illustrated in FIG. 3 in detail. Referring to FIG. 3, the bank control unit 14_0 includes an input controller 301, a data buffer 303, an address buffer 305 and an address selector 307. The input controller 301 receives the refresh flag signal RFLA0, the write control signal WCON and the write control signal RCON, and generates the data control signal DCON, the address control signal ACON and the bank control signal BCON0.

The data buffer 303 provides the input data DIN0 to the memory bank 10_0 as the bank data BDIN0. While a refresh operation is being performed with respect to DRAM cells included in the memory 10_0, the input data DIN0 and the input address AIN are temporarily stored in the data buffer 303 and the address buffer 305, respectively in response to the data control signal DCON. After the performance of the refresh operation on the DRAM cells included in the memory bank 10_0 is completed, the input address AIN temporarily stored in the address selector 307 is provided to the address selector 10_0.

The address selector 307 provides the input address AIN to the memory bank 10_0 as the selection address SADD0. While the refresh operation is being performed with respect to the DRAM cells included in the memory bank 10_0, the refresh address ARF is provided to the memory bank 10_0 as the selection address SADD0 in response to the address control signal ACON.

Furthermore, the bank control signal BCON0 controls the refreshing, writing and reading of the memory bank 10_0 in response to the refresh flag signal RFLA0, the write control WCON and the read control signal RCON.

Figure 4:
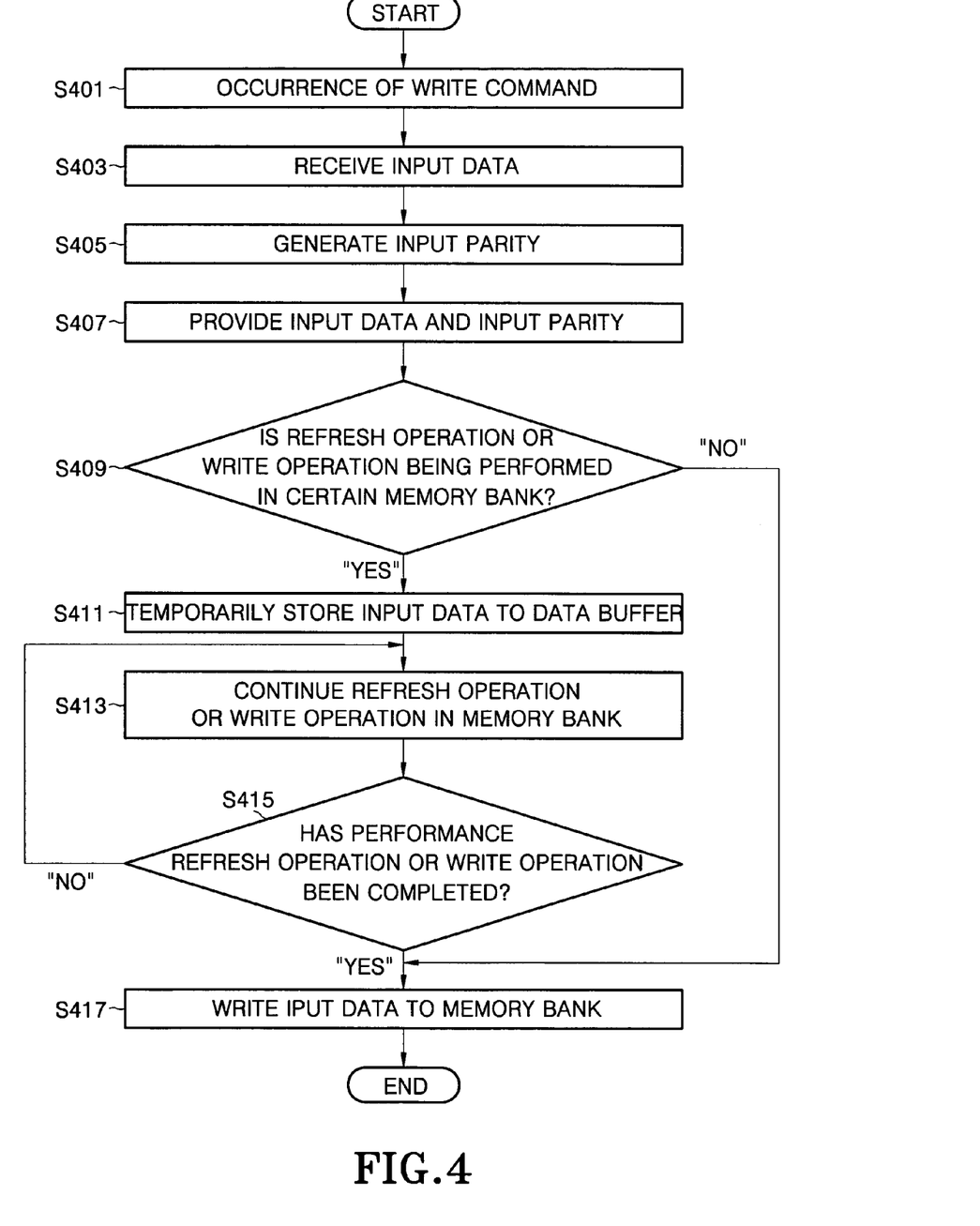
FIG. 4 is a flowchart for describing a write operation of the SRAM-compatible memory according to the embodiment of the present invention.

FIG. 4 is a flowchart showing a write operation of the SRAM-compatible memory according to the embodiment of the present invention. Referring to FIG. 4, the write operation of the SRAM-compatible memory will be described below. When a write command occurs at step S401, eight input data DIN0 to DIN7 are received at step S403. An input parity DINP having a certain preset parity value is generated in conjunction with the input data DIN0 to DIN7 at step S405. The input data DIN0 to DIN7 are provided to the memory banks 10_0 to 10_7, respectively, and the input parity DINP is provided to the parity bank 12 at step S407.

Subsequently, it is determined whether a refresh operation or a write operation for a previous frame is being performed in any of the memory banks 10_0 to 10_7 at step S409. If the refresh operation or a write operation for the previous frame is being performed in a memory bank 10_0, . . . , or 10_7, input data DIN0, . . . , or DIN7 is temporarily stored in the data buffer 303 at step S411, and the refresh operation or write operation continues in the memory bank 10_0, . . . , or 10_7 at step S413. If the performance of the refresh operation or write operation is completed at step S415, the input data DIN0, . . . , or DIN7 temporarily stored in the data buffer 303 is written into one or more specified DRAM cells of the memory bank at step S417. In contrast, if at step S409, the refresh operation or write operation is not being performed in the memory banks 10_0 to 10_7, the input data DIN0, . . . , or DIN7 is not temporarily stored in the data buffer 303 but is written into one or more specified DRAM cells of the memory bank at step S417.

For example, if the refresh operation is being performed in a memory bank 10_7, input data DIN0 to DIN6 and the parity data DINP are written into the remaining memory banks 10_0 to 10_6, except for the memory bank 10_7, and the parity bank 12, respectively, and the writing of the input data is suspended only in the memory bank 10_7. Subsequently, after the performance of the refresh operation has been completed, the suspended writing of the input data is performed. If a read operation occurs while the suspended writing of the input data is being performed, the input data whose writing is suspended may be recovered using the parity data DINP stored in the parity bank 12.

Although the above description with reference to FIGS. 3 and 4 is mainly directed to the memory banks 10_0 to 10_7, such operation is also performed with respect to the parity bank 12 in like manner.

Figure 5:
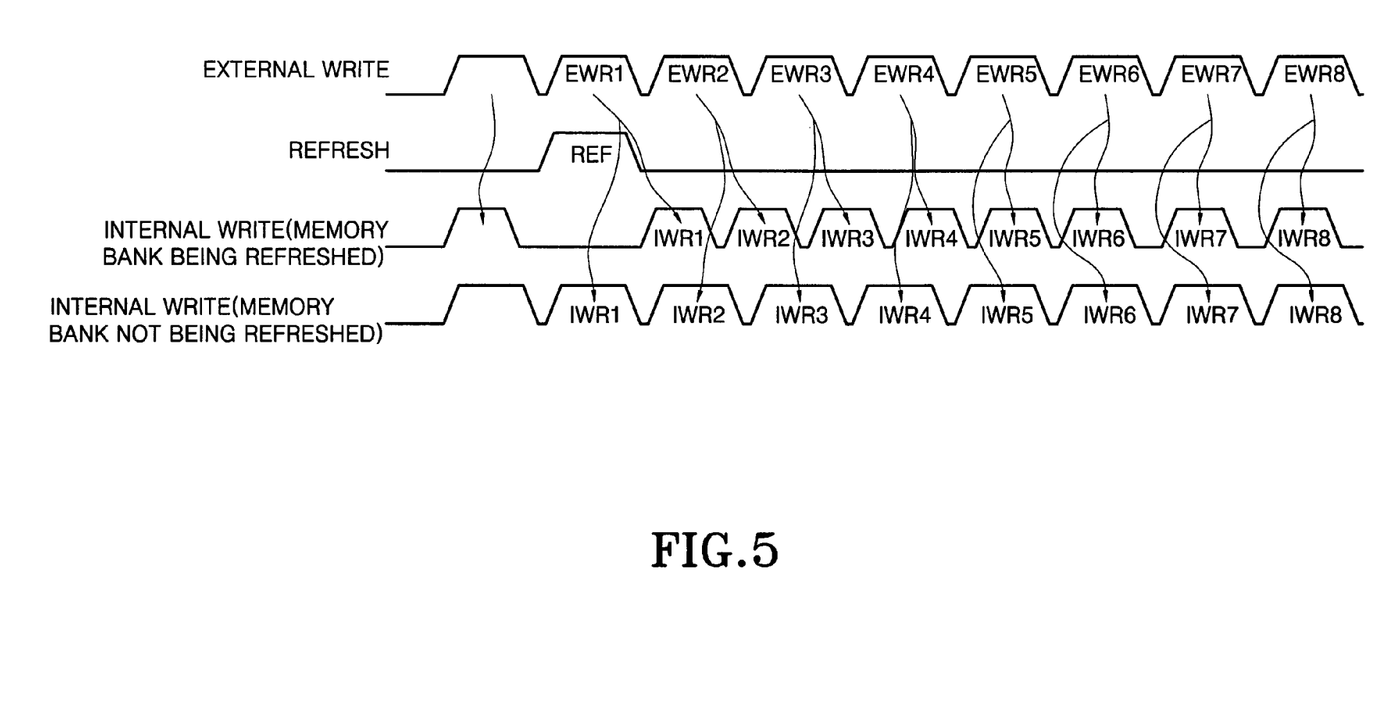
FIG. 5 is a timing chart for describing the write operation of the SRAM-compatible memory according to the embodiment of the present invention.

FIG. 5 is a timing chart for describing a write operation of the SRAM-compatible memory according to the embodiment of the present invention. This writing operation is performed under certain conditions. In this case, when a refresh operation is requested for a memory bank, an external write operation occurs with respect to the same memory bank as soon as the refresh operation starts. Thereafter, other external write operations are performed successively in the memory bank upon completion of the refresh operation.

In this description, the "external write operation" refers to a write access operation that is exhibited outside the SRAM-compatible memory. The required time that is externally secured is referred to as an "external write time Twce." A write access operation exhibited in the SRAM-compatible memory is referred to as an "internal write operation". The maximally required time secured for the "internal write operation" is referred to as an "internal write time Twci." The external and internal write operations of the SRAM-compatible memory and the external and internal write time Twce, Twci for fulfilling the write operation will be described below.

Referring to FIG. 5, the multiple external write operations EWR1, ..., EWR8, ... specifying the same memory bank (in this embodiment, referred to as a "corresponding memory bank") successively occur. The example shown in FIG. 5 is the case where, when the first write operation EWR1 occurs, a refresh operation is being performed in the certain memory bank. That is, when the first external write operation EWR1 occurs, the refresh operation REF is being performed in the certain memory bank. Therefore, the performance of the first internal write operation IWR1 corresponding to the first external write operation EWR1 is suspended until the refresh operation is completed. After the refresh operation is completed (that is, after the REF signal becomes "low"), the first internal write operation IWR1 is performed. Additionally, internal write operations IWR2 to IRW5 corresponding to following write operations EWR2 to ERW5 are performed after delays. In the example of FIG. 5, the first to fifth internal write operations are performed after delays, and the internal write operations following the sixth write operation are performed without delay. As described above, notwithstanding no separate timing period for the refresh operation is secured externally, the SRAM-compatible memory of the present invention performs internal write operations and refresh operations of the number identical to that of external write operations. That is, the SRAM-compatible memory of the present invention performs internal access operations of the number larger than that of external access operations by one.

Next, the relation between the external write time Twce and the internal write time Twci that are required to allow the SRAM-compatible memory of the present invention to normally perform a write operation will is described below.

The maximal number N of external write operations that can occur in a single period (Tper) for a refresh operation is expressed as the following Equation 1.

$$N = Tper/Twce \quad (1)$$

In the SRAM-compatible memory of the present invention, the time Tref internally required for the refresh operation is approximately equal to the internal write time Twci. Accordingly, in the present specification, it is assumed that the time Tref is equal to the time Twci. Accordingly, the internal write time Twci can be expressed as the following Equation 2.

$$Twci = Tper/(N+1) \quad (2)$$

The following Equation 3 can be obtained by combining Equation 1 with Equation 2.

$$Twci = (Tper*Twce)/(Tper+Twce) \quad (3)$$

In Equation 3, when it is assumed that Tper=10 μs and Twce=100 ns, Twci is about 100 ns. Accordingly, the internal write time Twci can be secured in approximately the same manner as the external write time.

Meanwhile, as shown in FIG. 5, an internal write operation in a memory bank, where a refresh operation is not being performed, is performed at the same timing as the external write operation. Furthermore, the internal write time is the same as the external write time.

Figure 6:
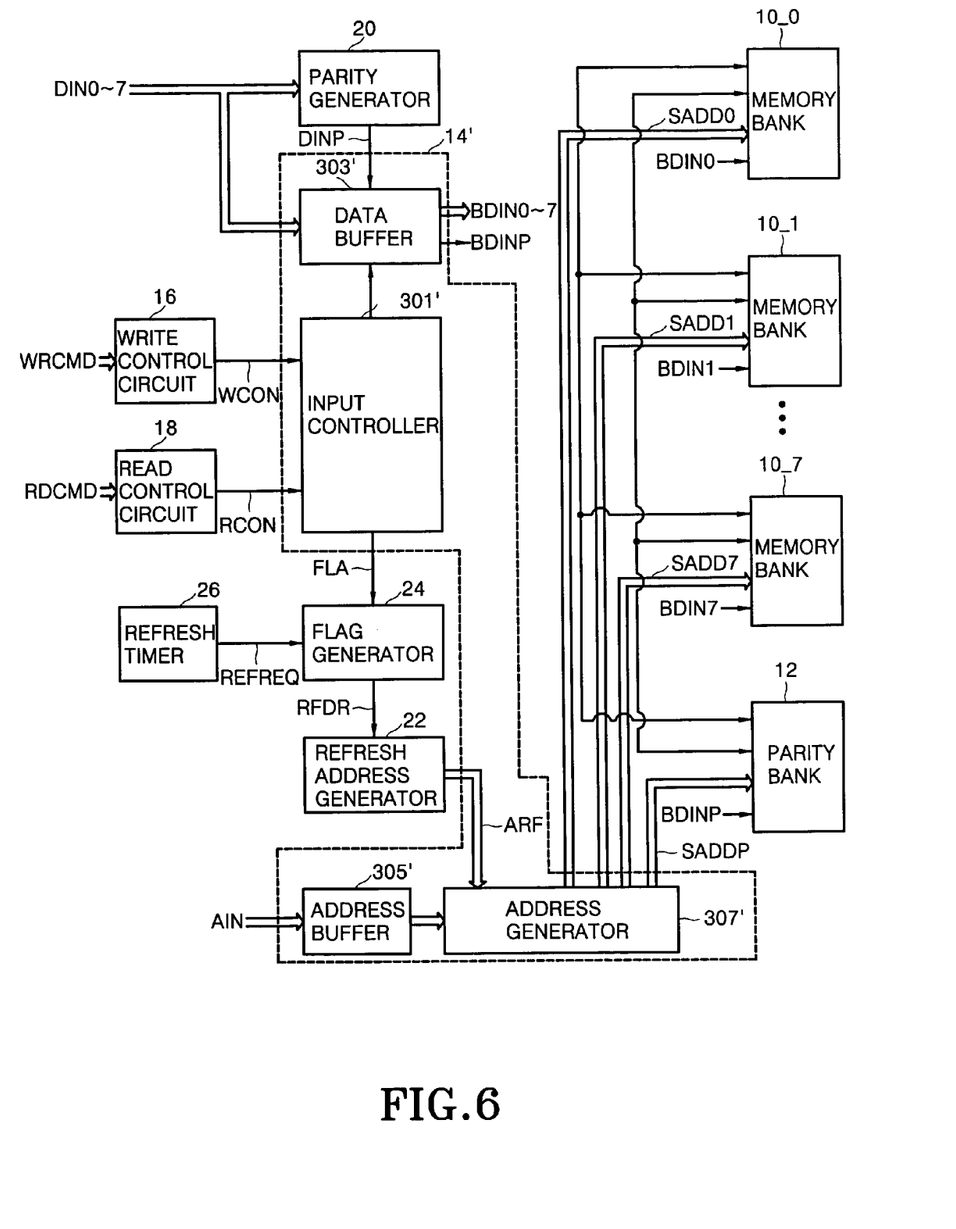
FIG. 6 is a block diagram illustrating an SRAM-compatible memory according to another embodiment of the present invention.

FIG. 6 is a block diagram illustrating an SRAM-compatible memory according to another embodiment of the present invention, which is a variation of the embodiment of the present invention shown in FIG. 1. The embodiment of FIG. 6 has a similar structure to that of the embodiment in FIG. 1. In contrast with the embodiment of FIG. 1 includes bank control units and a parity control unit that correspond to memory banks and a parity bank, respectively, the embodiment of FIG. 6 includes a signal control unit 14' that is shared by memory banks and a parity bank. The same reference numerals are used to designate the same components in FIGS. 1 and 6, and the same reference numerals with an apostrophe (') are used to designate the same components in FIGS. 3 and 6. Furthermore, since the construction and operation of the components of FIG. 6 are substantially same as those of the corresponding components of FIGS. 1 and 3, a detailed description thereof is omitted in the present embodiment.

Although the above embodiments of the present invention have been disclosed for illustrative purposes, those skilled in the art will appreciate that various modifications, additions and substitutions are possible. For example, in the write operation of the SRAM-compatible memory of the present invention, the operation in which the writing of input data to specified DRAM cells is suspended, is described in relation to the refresh operation. However, the operation in which the writing of input data to specified DRAM cells is suspended, may also be performed in the case where the write operation for a previous frame is being performed. Therefore, it could be understood that the operation in which the writing of input data to specified DRAM cells is suspended, has been described in relation to the refresh operation for the purpose of describing an exemplary embodiment of the present invention. Accordingly, the scope of the present invention must be determined depending on the spirit of the appended claims.

In the DRAM-compatible memory and method of driving the same in accordance with the present invention, a plurality of memory banks independently performs a plurality of write operations, respectively. Accordingly, even while refresh operations or writing operations for previous frames are being performed in some memory banks, it is possible to write data to the DRAM cells of the remaining memory banks. As a result, in the DRAM-compatible memory and method of driving the same in accordance with the present invention, a reduction in the speed of a write operation due to a refresh operation can be prevented, and it is possible to recovery and extract input data that is not written to DRAM cells for a current frame.

What is claimed is:

1. A static random access memory compatible (SRAM-compatible) memory having a plurality of memory banks each having a plurality of dynamic random access memory (DRAM) cells arranged in a matrix form defined by rows and columns, the SRAM-compatible memory interfacing with an external system in which no timing period is externally set for a refresh operation of the DRAM cells, comprising:

the plurality of memory banks configured to separately store input data corresponding to a single bit in DRAM cells specified by an input address externally provided, wherein write operations of the memory banks are independently controlled such that when a refresh operation or a write operation for a previous frame is being performed in a certain memory bank, write operation of input data is independently performed with respect to the respective memory banks except for the certain memory bank in both of the refresh and write operations;

a parity generator for generating an input parity based on the input data, the input parity having a certain preset parity value in conjunction with the input data; and a parity bank for storing the input parity.

2. The SRAM-compatible memory as set forth in claim 1, further comprising:

a plurality of bank control units for controlling the refresh operation and the write operation of the memory banks, each of the bank control units being associated with corresponding one of the memory banks; and a parity control unit for controlling the refresh operation and the write operation of the parity bank.

3. The SRAM-compatible memory as set forth in claim 2, wherein the bank control units each including;

a data buffer for storing input data whose write operation in a memory bank is suspended due to a refresh operation or a write operation for a previous frame in the memory bank; and an address buffer for storing input address designating DRAM cells of the memory bank.

4. The SRAM-compatible memory as set forth in claim 3, wherein the data buffer provides the input data stored therein to the memory bank after the refresh operation or the write operation is completed, and the address buffer provides the input address stored therein to the memory bank after the refresh operation or the write operation is completed.

5. The SRAM-compatible memory as set forth in claim 2, further comprising a refresh address generator for generating a refresh address to designate DRAM cells of the memory banks to be refreshed.

6. The SRAM-compatible memory as set forth in claim 5, wherein each of the bank control units further comprises an address selector for selecting one of the input address and the refresh address and providing the selected address to corresponding one of the memory banks to perform the write operation or the refresh operation with respect to DRAM cells in the corresponding one of the memory banks.

7. The SRAM-compatible memory as set forth in claim 2, further comprising a flag generator for generating a refresh flag signal to the respective bank control units, each of the bank control units controlling the refresh operation in corresponding one of the memory banks in response to the refresh flag signal.

8. The SRAM-compatible memory as set forth in claim 7, wherein the flag generator generates a refresh driving signal which is periodically activated, the refresh driving signal controlling a refresh address generator to generate a refresh address to designate DRAM cells of the memory banks to be refreshed.

9. The SRAM-compatible memory as set forth in claim 8, wherein the refresh address is changed in response to a predetermined number of activations of the refresh driving signal.

10. The SRAM-compatible memory as set forth in claim 9, further comprising a refresh timer for generating a refresh request signal to the flag generator, the refresh driving signal being activated in response to the refresh request signal.

11. The SRAM-compatible memory as set forth in claim 2, wherein the parity bank has a substantially same structure as each of the memory banks.

12. A method of driving a static random access memory-compatible (SRAM-compatible) memory having a plurality of memory banks each having a plurality of dynamic random access memory (DRAM) cells arranged in a matrix form defined by rows and columns, the SRAM-compatible memory interfacing with an external system in which no timing period is externally set for a refresh operation of the DRAM cells, comprising:

providing multiple pieces of input data to the memory banks, each piece of the input data corresponding to a single bit being provided separately to corresponding one of the memory banks;

determining whether a refresh operation or a write operation for a previous frame is being performed in the memory banks;

storing a piece of the input data in a data buffer if the refresh operation or the write operation is being performed in a certain memory bank for both the refresh and write operations, wherein the piece of the input data is provided to the certain memory bank and write operation of the piece of the input data is suspended; and writing the piece of the input data stared in the data buffer into DRAM cells of the certain memory bank after the refresh operation or the write operation is completed;

wherein the memory banks except for the certain memory bank independently perform write operations, while the refresh operation or the write operation for the previous frame is performed with respect to the certain memory bank.

13. The method as set forth in claim 12, further comprising:

obtaining an input parity from a predetermined preset parity value and the input date; and writing the input parity into a parity bank.

14. The method as set forth in claim 12, further comprising:

storing an input address designating DRAM cells in the certain memory bank into an address buffer; and providing the input address to the certain memory bank after the refresh operation or the write operation is completed.

* * * * *